United States Patent [19]

Piguet

[11] 4,057,741
[45] Nov. 8, 1977

[54] LOGIC CIRCUIT FOR BISTABLE D-DYNAMIC FLIP-FLOPS

[75] Inventor: Christian Piguet, Neuchatel, Switzerland

[73] Assignee: Lasag S.A., Thun, Switzerland

[21] Appl. No.: 613,917

[22] Filed: Sept. 16, 1975

[30] Foreign Application Priority Data

Sept. 16, 1974 Sweden ............................... 7401255

[51] Int. Cl.² ...................... H03K 3/286; H03K 3/353
[52] U.S. Cl. ................................. 307/279; 307/221 C; 307/269
[58] Field of Search ........... 307/220 C, 221 C, 224 C, 307/225 C, 205, 251, 208, 269, 288, 279; 58/23 A, 23 BA, 50 R

[56] References Cited

U.S. PATENT DOCUMENTS

| | | | |
|---|---|---|---|
| 3,619,644 | 11/1971 | Vittoz | 307/279 X |
| 3,749,937 | 7/1973 | Rogers | 307/251 X |
| 3,866,186 | 2/1975 | Suzuki | 307/205 X |
| 3,887,822 | 6/1975 | Suzuki | 307/279 |

OTHER PUBLICATIONS

Suzuki et al., "Clocked CMOS Calculator Circuitry"; *IEEE Journal of Solid-State Circuits,* vol. SC-8, No. 6, pp. 462–469; 12/1973.

*Primary Examiner*—John S. Heyman
*Assistant Examiner*—Larry N. Anagnos
*Attorney, Agent, or Firm*—Sherman & Shalloway

[57] ABSTRACT

A logic circuit for dynamic D-flip-flop includes five n-channel MOS transistors and five p-channel MOS transistors. When used as a shift register stage, it works correctly without any additional delay element or capacitor. With two more MOS-transistors, the logic circuit works correctly with any sequence of input signals.

8 Claims, 7 Drawing Figures

LOGIC CIRCUIT FOR BISTABLE D-DYNAMIC FLIP-FLOPS

BACKGROUND OF THE INVENTION

1 Field of the Invention

The present invention relates to a logic circuit for a dynamic D-flip-flop, which uses complementary insulated grid field effect transistors.

2. Prior Art and Technical Considerations

Dynamic D-flip-flops are frequently used in electronics because, among other things, they are convenient to use in the production of dynamic shift registers.

The function of, as well as many types of dynamic, D-flip-flop circuits are well known. However, no existing embodiment of such circuitry guarantees the avoidance of operational failure with a minimum number of transistors and without using delay elements such as capacitors. One of the most elaborate circuits known thus far, disclosed in the IEEE Journal of Solid State Circuits vol. Sc-8 No. 6, Dec. 1973, under the title "Clocked CMOS Calculator Circuitry", does not satisfy all known applications for dynamic D-flip flops. In spite of the fact that this circuit has only ten transistors. In fact, this circuitry requires a clock signal H both in its true H form and also in a complementary $\overline{H}$ form. This is disadvantageous, because of area or space requirements when this circuit is integrated, power consumption when the high frequency signals H and $\overline{H}$ are applied. From an operational aspect this circuit cannot be looped as a dynamic divider, as opposed to a true dynamic D-flip-flop. Accordingly, this circuit can function only as a shift register element.

OBJECTS OF THE INVENTION

It is an object of the present invention to provide a new and improved logic circuit for a dynamic D-flip-flop.

It is an additional object of the present invention to provide a logic circuit for a dynamic D-flip-flop that has no risk of operational failure.

It is still another object of the present invention to provide a logic circuit for a dynamic D-flip-flop requiring a minimum number of transistors and no delay element.

It is an additional object of this invention to provide a logic circuit for a dynamic D-flip-flop, which minimizes surface area when incorporated into an integrated circuit, and which has relatively short connection distances between elements.

It is still an additional object of the present invention to provide a logic circuit for a dynamic D-flip-flop, which needs only a single clock signal.

SUMMARY OF THE INVENTION

According to the invention, the afore-mentioned objects are attained by a flip-flop logic circuit, incorporating at least three logic gates connected between a positive pole of a voltage supply and ground. Each gate produces an internal variable A, B or C of the circuit and is composed of at least three MOS transistors. These transistors are connected in series between a positive pole and ground, and are controlled by at least two variables whereof one is a clock signal H. The first gate is formed by a transistor $T_1$ having a first type of conductivity whose source is connected to the positive pole and the drain is connected to the source of another transistor $T_2$ having the same type of conductivity. The drain of the afore-mentioned transistor $T_2$ is connected at node A on the one hand to the drain of a transistor $T_3$ with a second type of conductivity, whose source is connected to ground, and on the other hand to the grids of two transistors $T_4$ and $T_6$ of the second gate. The grids of the two transistors $T_1$ and $T_3$ of the first gate are connected to the control input D of the structure, while the grid of the third transistor $T_2$ of the said first gate is connected to the clock input H. The second gate of the structure is formed by the transistor $T_4$ having the first type of conductivity and having a grid connected to the drain of transistor $T_3$ of the first gate. The source of transistor $T_4$ is connected to the positive pole and the drain is connected to the source of another transistor $T_5$ with the first type of conductivity. The drain of transistor $T_5$ is connected at node B on the one hand to the drain of transistor $T_6$ with the second type of conductivity, and on the other hand to the grids of transistors $T_8$ and $T_9$ of the third gate. The source of transistor $T_6$ is connected to the drain of another transistor $T_7$ with the second type of conductivity whose source is connected to ground, the grids of the two transistors $T_5$ and $T_7$ being connected to the clock input H. The third gate of the structure is formed by a transistor $T_8$ with the first type of conductivity, whose source is connected to the positive pole and whose drain is connected at node C on the one hand to the output of the structure, and on the other hand to the drain of a transistor $T_9$ with the second type of conductivity. The source of transistor $T_9$ is connected to the drain of a transistor $T_{10}$ of the second type of conductivity, whose source is connected to ground, and whose grid is connected to clock input H.

An advantageous embodiment of the invention is characterized in that one more transistor $T_{21}$ with the first type of conductivity has its grid connected to node B and is connected in parallel with transistor $T_2$ of the first gate, and an additional transistor $T_{71}$ with the second type of conductivity has its grid connected to node C and is connected in parallel with transistor $T_7$ of the second gate.

The first type of conductivity may be the p type or n type respectively, and the second, of the n type or p type respectively. In the second case, the positive pole has to be changed to a negative pole.

In the following discussion, the invention is to be described in detail, the first type of conductivity being the p type, and the second the n type, with reference to the attached drawing which represents:

DETAILED DESCRIPTION

Figure 1:
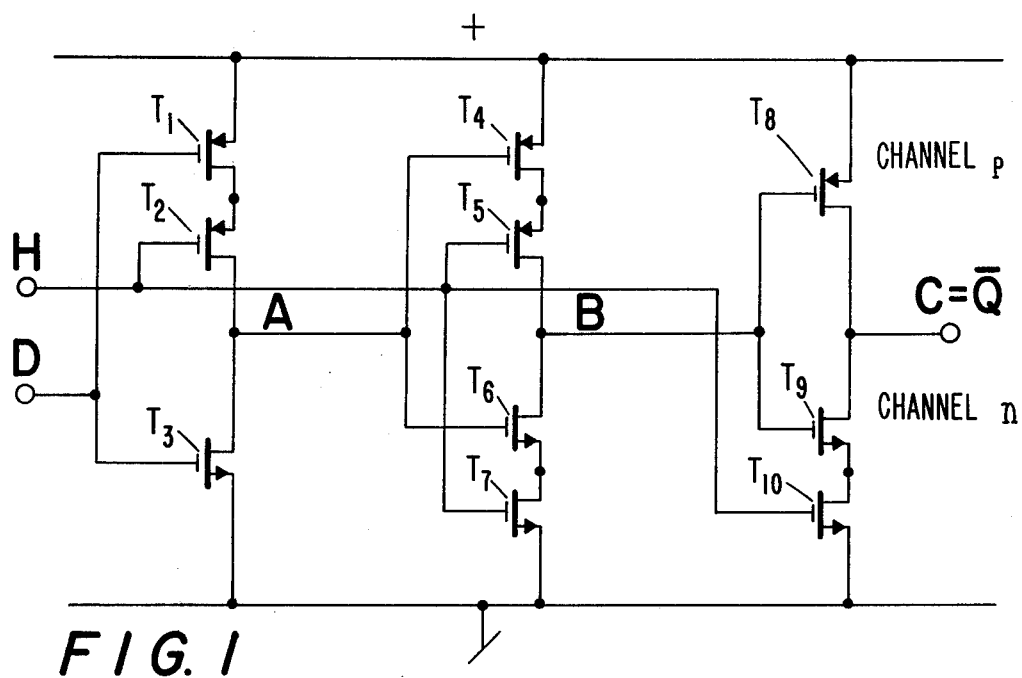
FIG. 1 is a schematic illustration of an embodiment showing a dynamic D-flip-flop according to the invention.

FIG. 1 shows a detailed schematic illustration of the base circuit according to the present invention, i. e. a non-ideal dynamic D-flip-flop formed by ten field effect transistors $T_1$ through $T_{10}$ with insulated grids. These transistors are known also as MOS [metal-oxide-semiconductor]transistors. Five of the transistors are channel $p$ transistors and five transistors are channel $n$ transistors. It is to be understood that this circuit generates three internal variables A, B and C and is supplied with two external variables, H and D, of which H is a clock signal and D is a command signal. Variable C corresponds directly to the inverse of the output signal, i.e. signal $\overline{Q}$.

Figure 2:
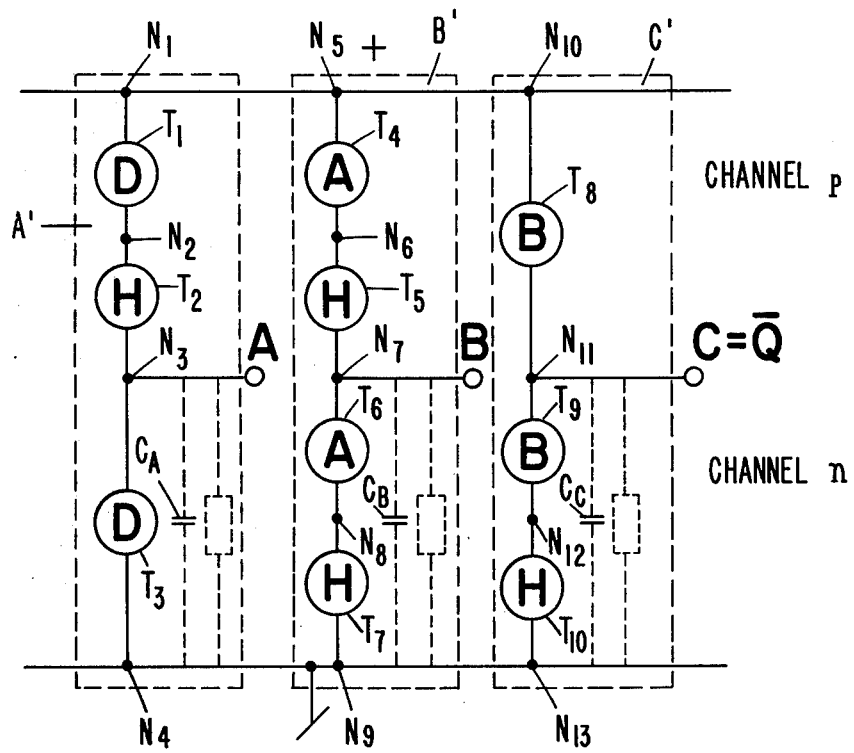
FIG. 2 is a schematic illustration of the structure of the D-flip-flop shown in FIG. 1.

The simplified schematic of the D-flip-flop shown in FIG. 2 explains the operation of the circuit of FIG. 1. In FIG. 2, the capital letters in the circles representing the transistors indicate the variable controlling the transistors. In this simplified schematic, three different gates can be distinguished; i. e. gate A' producing internal variable A, gate B' producing internal variable B, and gate C' producing internal variable C, which corresponds to the inverse output signal $\overline{Q}$.

In operation, it should first be remembered that an MOS $p$ channel transistor is blocked, if its grid is at a positive potential corresponding to a logic value 1, and conducts if its grid is at ground corresponding to a logic value of 0. The opposite case is true for an $n$ channel MOS transistor.

Assuming that the two external variables H and D are equal to zero i. e. H = 0 and D = 0, transistors $T_1$ and $T_2$ conduct whereas transistor $T_3$ is blocked. Consequently, node $N_3$ is connected to the positive pole +, which in turn causes the variable A to assume the value A = 1. This blocks transistor $T_4$ and causes transistor $T_5$ to conduct. Transistor $T_6$ also conducts while transistor $T_7$ is blocked. Consequently, node $N_7$ floats, therefore, variable B floats. However, a stray capacitance made by the sum of the drain capacitances of $T_5$ and $T_6$ the connection capacitance and the grid capacitances of $T_8$ and $T_9$ controlled by variable B, makes it possible to achieve a tempory memory effect. The capacitance $C_B$ is drawn in dashed lines in FIG. 2, because it is intrinsic to the circuitry and not included as a passive additional element. The capacitance represented by $C_B$ makes it possible for a node that is temporarily neither connected to the positive pole (+) nor to ground to maintain its previous value. This tempory state cannot last for a long time, as leakage current will discharge $C_B$, there must be frequent changes of state. Such a circuit has a dynamic character.

Assuming that variable B has the value B = 0, the stray capacitance of node $N_7$ corresponding to B, which is floating, will maintain the value B = 0. Under these conditions, and in view of the fact that the value of the external variable H is equal to zero, transistor $T_8$ conducts, transistor $T_9$ is blocked and transistor $T_{10}$ is blocked, which means that node $N_{11}$ is connected to the positive pole (+), so that variable C assumes the value C = 1. The structure hence assumes a first stable state I as follows: A = 1, B = 0 floating, C = 1, H = 0 and D = 0, or in other words, ABC = $1\underline{0}1$ and HD = 00.

If at this moment variable H is changed from zero to one, to produce a second stable state II that corresponds to the following conditions ABC = $1\underline{0}1$ and HD = 10, the different transistors of gate A' assume the following conduction states:
 $T_1$ conducts,
 $T_2$ is blocked,
 $T_3$ is blocked
which results in the node $N_3$ is floating, so that variable A floats. Because of the capacitance represented by capacitor $C_A$ variable A keeps its former value of A = 1, therefore, at gate B' we have the following conditions:
 $T_4$ is blocked,
 $T_5$ is blocked,
 $T_6$ conducts and
 $T_7$ conducts
which has the effect of connecting node $N_7$ to zero, so that variable B takes the value B = 0.
For gate C':
 $T_8$ conducts,
 $T_9$ is blocked and
 $T_{10}$ conducts
which connects node $N_{11}$ to positive (+) and keeps variable C at the value C = 1.

If external variable H is then brought back to zero, none of the internal variables A, B or C will vary, because for gate A':
 $T_1$ conducts,
 $T_2$ conducts and
 $T_3$ is blocked
so that node $N_3$ is connected to positive pole (+) and variable A confirms its value of A = 1.
For gate B':
 $T_4$ is blocked,
 $T_5$ conducts,
 $T_6$ conducts and
 $T_7$ blocks
which causes variable B to float. Because of the capacitance represented by capacitor C variable B is held to its previous value of B = $\underline{0}$.
For gate C':
 $T_8$ conducts,
 $T_9$ is blocked and
 $T_{10}$ is blocked
so that variable C remains at its initial value of C = 1. By this transition, the dynamic flipflop structure has passed from stable state II to stable state I.

From the afore-mentioned discussion, it can be seen that the result of changes in external variable H while variable D is held at D = 0, do not in any way influence the value of variable C or of the output value $\overline{Q}$.

If however from stable state I equal to ABC = $1\underline{0}1$ and HD = 00 and variable D is changed from D = 0 to D = 1, we have the following conditions for gate A':
 $T_1$ is blocked,
 $T_2$ conducts and
 $T_3$ conducts
which results in variable A changing from A = 1 to A = 0, so that the circuit assumes an intermediate state, wherein ABC = $0\underline{0}1$ and HD = 01. This results in the following changes in the conditions of conductivity of transistors $T_4$, $T_5$, $T_6$ and $T_7$ of gate B':
 $T_4$ conducts,
 $T_5$ conducts,
 $T_6$ is blocked, and
 $T_7$ is blocked.
Consequently, variable B changes from B = 0 to B = 1. Thus the circuit passes to a second intermediate state corresponding to the conditions of ABC = 011 and HD = 01. This however causes the following modifications in the conductivities of the transistors of gate C':
 $T_8$ is blocked,
 $T_9$ conducts,
 $T_{10}$ is blocked, and
The variable C thus becomes floating: but because of capacitance $C_C$, variable C maintains its former value of C = $\underline{1}$. As a consequence, the preceding intermediate state is confirmed and becomes a third stable state III of the circuit which corresponds to the conditions ABC = 011 and HD = 01.

When starting from stable state II, wherein ABC = 101 and HD = 10 and if the variant H = 1 is not brought back to zero but D is varied from D = 0 to D = 1, the conductivities of the different transistors and consequently of internal variables A, B and C take the following values for gate A':

$T_1$ is blocked,
$T_2$ is blocked, and
$T_3$ conducts.

This has the effect that the value of variable A passes from A = 1 to A = 0, which produces the following intermediate state: ABC = 001 and HD = 11, having the following influence on gate B':

$T_4$ conducts
$T_5$ is blocked,
$T_6$ is blocked and
$T_7$ conducts.

This results in floating of the value of variable B. Because of capacitance $C_B$, variable B is kept at its earlier value of B = 0. The value of variable C does not change because neither variable B nor variable H have changed. Consequently, the earlier intermediate state is confirmed and becomes stable state IV with ABC = 001 and HD = 11.

At the instant at which D flipflop structure according to the invention is in the above-mentioned stable state IV, variable D can be varied so as to pass from D = 1 to D = 0. In other words, during the time when the clock signal H is positive, i.e. H = 1, external variable D varies from zero to one and returns to zero. This disturbing impulse on variable D causes for gate A' the following changes:

$T_1$ conducts,
$T_2$ is blocked and
$T_3$ is blocked, which makes variable A floating but holds it at former value of A = 0. As a result, neither variable B nor variable C are going to change values, which means that the circuit passes to a first undesired stable state NDI characterized by ABC = 001 and HD = 10 and does not return to the sought stable state II.

If from stable state IV when ABC = 001 and HD = 11, variable D is not changed but variable H is changed so that it changes from H = 1 to H = 0, the following changes are caused for gate A':

$T_1$ is blocked,
$T_2$ conducts and
$T_3$ conducts so that variable A is held to the value A = 0 while for gate B':

$T_4$ conducts,
$T_5$ conducts,
$T_6$ is blocked and
$T_7$ is blocked.

As a result, variable B becomes positive, i.e. B = 1. This provokes an intermediate state ABC = 011 and HD = 01 influencing the state of gate C' as follows:

$T_8$ blocks,
$T_9$ conducts, and
$T_{10}$ is blocked,

In other words, the intermediate state becomes stable state III corresponding to the conditions ABC = 011 and HD = 01.

If starting from stable state III variable D is returned to zero, the following happens in gate A':

$T_1$ conducts,
$T_2$ conducts and
$T_3$ is blocked so that variable A becomes positive and takes the value A = 1, which again influences the transistors of gate B' as follows:

$T_4$ is blocked,
$T_5$ conducts,
$T_6$ conducts and
$T_7$ is blocked.

Thus variable B becomes floating but holds its value of B = 1. The conditions for gate C' do not vary. Variable C remains floating and held at C = 1. The circuit is not returned to the desired stable state I, but passes into a second undesired stable state corresponding to conditions ABC = 111 and HD = 00.

If, on the other hand, starting from stable state III variable D is not varied, but variable H is varied so as to cause it to pass from H = 0 to H = 1, the following happens in gate A':

$T_1$ is blocked,
$T_2$ is blocked and
$T_3$ conducts so that variable A is unchanged and remains at A = 0. For gate B':

$T_4$ conducts,
$T_5$ is blocked,
$T_6$ is blocked and
$T_7$ conducts.

This results in variable B floating but held at its value of B = 1. The conductivities of the transistors of gate C' change in the following way:

$T_8$ is blocked,
$T_9$ conducts and
$T_{10}$ conducts so that variable C passes to zero, i.e. C = 0. The circuit has thus reached a new stable state V corresponding to the conditions ABC = 010 and HD = 11. By now bringing external variable H to zero, the circuit assumes the following state for gate A':

$T_1$ is blocked,
$T_2$ conducts and
$T_3$ conducts which has the effect that variable A remains at A = 0. For gate B' the following conditions therefore occur:

$T_4$ conducts,
$T_5$ conducts,
$T_6$ is blocked and
$T_7$ is blocked

Variable B is thus confirmed at its earlier value of B = 1. For gate C' the following conditions therefore occur:

$T_8$ is blocked,
$T_9$ conducts and
$T_{10}$ is blocked so that variable C becomes floating but is held at its value of C = 0. It follows that the structure takes a new stable state VI equal to ABC = 010 and HD = 01. This means that the changes of variable H while variable D remains equal to one do not affect internal variable C and thereby output Q.

If, starting from stable state V equal to ABC = 010 and HD = 11 we do not vary H, but rather D so as to bring this variable D back from D = 1 to D = 0, the following conditions result in gate A':

$T_1$ conducts,
$T_2$ is blocked and
$T_3$ is blocked which has the effect that variable A becomes floating but remains at its value of A = 0. For gate B' the following conditions therefore result:
$T_4$ conducts,
$T_5$ blocks,
$T_6$ blocks and
$T_7$ conducts
which has the effect that variable B becomes floating but remains held at B = 1. For gate C' the following conditions therefore occur:
$T_8$ is blocked,
$T_9$ conducts and
$T_{10}$ conducts
so that variable C is confirmed at its earlier value of C = 0. The structure has thus assumed a new stable state VII corresponding to the conditions ABC = 010 and HD = 10. Now we may again vary external variable H so as to bring it from H = 1 to H = 0, which causes the following changes for gate A':
$T_1$ conducts,
$T_2$ conducts and
$T_3$ is blocked
which has the effect that variable A becomes positive, i.e. A = 1, so that an intermediate state [corresponding to] ABC = 110 and HD = 00 occurs, influencing gate B' as follows:
$T_4$ is blocked,
$T_5$ conducts,
$T_6$ conducts and
$T_7$ blocks.
Variable B thus remains floating, held at value B = 1. Variable C also becomes floating, because for gate C':
$T_8$ is blocked,
$T_9$ conducts and
$T_{10}$ is blocked
which has the effect that the circuit assumes a new stable state VIII corresponding to the conditions ABC = 110 and HD = 00.

If from stable state VI corresponding to ABC = 010 and HD = 01 we vary variable D, from D = 1 to D = 0, the structure also will assume the above mentioned stable state VIII, because for gate A':
$T_1$ conducts,
$T_2$ conducts and
$T_3$ is blocked
and variable A takes the value A = 1. Therefore, for gate B' the following conditions result:
$T_4$ is blocked,
$T_5$ conducts,
$T_6$ conducts and
$T_7$ is blocked
so that variable B becomes floating but remains at B = 1 and for gate C':
$T_8$ is blocked,
$T_9$ conducts and
$T_{10}$ is blocked
which has the effect that variable C becomes floating but remains at its value of C = 0. The stable state that is attained thus corresponds to above mentioned stable state VIII for conditions ABC = 110 and HD = 00. If starting from this stable state we vary D from zero to one, the following happens for gate A':
$T_1$ is blocked,
$T_2$ conducts and
$T_3$ conducts
so that variable A becomes A = 0, bringing about an intermediate state corresponding to ABC = 010 and HD = 01. for gate B':

$T_4$ conducts,
$T_5$ conducts,
$T_6$ is blocked and
$T_7$ is blocked
It follows that variable B is confirmed at its value of B = 1. Variable C does not change, however, because for gate C':
$T_8$ is blocked,
$T_9$ conducts and
$T_{10}$ is blocked
which has the effect that variable C becomes floating but is held at its value of C = 0. It should be observed that bringing variable D back from zero under these conditions, to one, allows the circuit to return to stable state VI.

When starting from stable state VIII mentioned above, variable H is changed from zero to one, the circuit finally returns to stable state II, because for gate A':
$T_1$ conducts,
$T_2$ is blocked and
$T_3$ is blocked
and variable A becomes floating but is held at A = 1. Therefore for gate B':
$T_4$ is blocked
$T_5$ is blocked
$T_6$ conducts and
$T_7$ conducts
which has the effect that variable B takes the value B = 0, so that an intermediate state ABC = 100 and HD = 10 influence gate C' as follows:
$T_8$ conducts,
$T_9$ is blocked and
$T_{10}$ conducts
so that variable C becomes positive or C = 1. The structure thus has assumed stable state II corresponding to the conditions ABC = 101 and HD = 10.

To bring the structure back to stable state IV from the undesired stable state NDI, it suffices to change variable D from D = 0 to D = 1, which has the following effect on gate A':
$T_1$ is blocked,
$T_2$ is blocked and
$T_3$ conducts
so that variable A is confirmed in its value of A = 0. Therefore gate B' assumes the following condition:
$T_4$ conducts,
$T_5$ blocks,
$T_6$ blocks and
$T_7$ conducts
so that variable B remains floating and is held at its value of B = 0. Therefore gate C' assumes the following conditions:
$T_8$ conducts,
$T_9$ is blocked and
$T_{10}$ conducts
which holds the value of variable C at C = 1.

The stable state that is reached corresponds to sought stable state IV which corresponds to conditions ABC = 001 and HD = 11.

If, starting from undesired stable state NDI corresponding to ABC = 001 and HD = 10, we change external variable H from one to zero, the following happens for gate A':
$T_1$ conducts,
$T_2$ conducts and
$T_3$ blocks which has the effect that variable A assumes the value A = 1. For gate B', assuming that variable A has not yet changed, the following conditions result:

$T_4$ conducts,
$T_5$ conducts,
$T_6$ is blocked and
$T_7$ is blocked so that variable B takes the value B = 1.

The variation of H influences the two gates A' and B'. Therefore, there is a contest between these two gates to determine which one will change its value first. This causes difficulties and it is for this reason that this transition is forbidden in normal operation of the circuitry. This flipflop is therefore called non-ideal.

When the intermediate state is ABC = 111 and HD = 00, and the starting state was ABC = 001 and HD = 10, the two variables cannot simultaneously change value. Consequently, there are two different behavior patterns resulting from the contest between the two variables A and B. In the first pattern, variable A changes before variable B and an intermediate state ABC = 101 and HD = 00, which results in the stable state I. In the second pattern, variable B changes before variable A, resulting in an intermediate state ABC = 011 and HD = 00. Variable B is then impressed on gate C', resulting in the following conditions:

$T_8$ is blocked,
$T_9$ conducts and
$T_{10}$ is blocked.

Consequently, variable C is floating and retains its value of C = 1. Variable A then influences variable B, which becomes floating so that the state in which the structure ends up is ABC = 111 and HD = 00. This is undesired stable state NDII. Starting from the undesired stable state NDII, which corresponds to ABC = 111 and HD = 00, it is also possible to make two different transitions, namely to change variable H from zero to one, which causes gate A' to have the following conditions:

$T_1$ conducts,
$T_2$ blocks and
$T_3$ blocks so that variable A becomes floating but keeps its value of A = 1. For gate B' then, if variable B changes before variable C, the following conditions result:

$T_4$ is blocked,
$T_5$ is blocked,
$T_6$ conducts and
$T_7$ conducts which changes the value of variable B from B = 1 to B = 0 and creates an intermediate state corresponding to ABC = 101 and HD = 10. For gate C', varying after the change of B, the following conditions exist:

$T_8$ conducts,
$T_9$ blocks and
$T_{10}$ conducts which has the effect that variable C is held at C = 1, which confirms the intermediate state and makes it a stable state corresponding to stable state II, wherein ABC = 101 and HD = 10.

Here again, there is a contest between variables B and C. In fact, if variable C changes before variable B, we get different behavior. Since variable B is still on B = 1, if H passes from 0 to 1, gate C' acts as follows:

$T_8$ is blocked,
$T_9$ conducts and
$T_{10}$ conducts so that variable C takes the value C = 0. Then only gate B' changes its state taking, as before, the value B = 0. Consequently, we get an intermediate state ABC = 100 and HD = 10. Since variable B has gone to zero, gate C' again changes state as follows:

$T_8$ conducts,
$T_9$ is blocked and
$T_{10}$ conducts so that variable C takes the value C = 1. The state in which the structure ends up is thus ABC = 101 and HD = 10, namely stable state II. This transition is forbidden in normal operation of the structure, because in one case variable C temporarily passes to a value of zero, and in the other case, it is permanently equal to one. Starting from undesired stable state NDII corresponding to ABC = 111 and HD = 00, it is also possible to change D from zero to one, which causes the following transitions: For gate A':

$T_1$ is blocked,
$T_2$ conducts and
$T_3$ conducts which has the effect that variable A passes from A = 1 to A = 0, which establishes an intermediate state equal to ABC = 011 and HD = 01, which influences gate B' as follows:

$T_4$ conducts,
$T_5$ conducts,
$T_6$ blocks and
$T_7$ blocks and variable B is confirmed in its value of B = 1. For gate C':

$T_8$ is blocked,
$T_9$ conducts and
$T_{10}$ is blocked which has the effect that variable C is floating and remains confirmed at its value of C = 1. This changes the former intermediate state into a stable state corresponding to stable state III with the conditions ABC = 011 and HD = 01.

From what has been demonstrated above, it follows that the circuit never remains blocked or trapped in an undesired stable state, but ends always in a desired stable state. Accordingly, the D-flip-flop circuit according to this invention has no parasitic cycles. In addition, except for the two transitions that we have forbidden or prevented in using this flip-flop so that it does not have these transitions, all the other transitions have only a single variable change state at one time and by transition, thus forbidding any possibility of competition between states, thereby ensuring risk free operation.

Operation of the dynamic D-flip-flop according to FIGS. 1 and 2, can be conveniently understood, with the aid of a table of states, which shows the different transitions in a synchronous as well as an asynchronous mode of operation of the circuit. In table I, stable states I through VIII assumed by the structure are surrounded by a solid-line circle, while the two undesired stable states NDI and NDII are surrounded by dashed-line circles. Moreover, the transitions according to synchronous mode of operation are indicated by solid-line arrows, while the transitions according to asynchronous mode of operation are indicated by dashed-line arrows. In addition, the states of internal variables A, B and C that are held by capacitances only are underlined. To facilitate a comparison between this table and the above description, the same numbering of the stable states is included.

Table 1

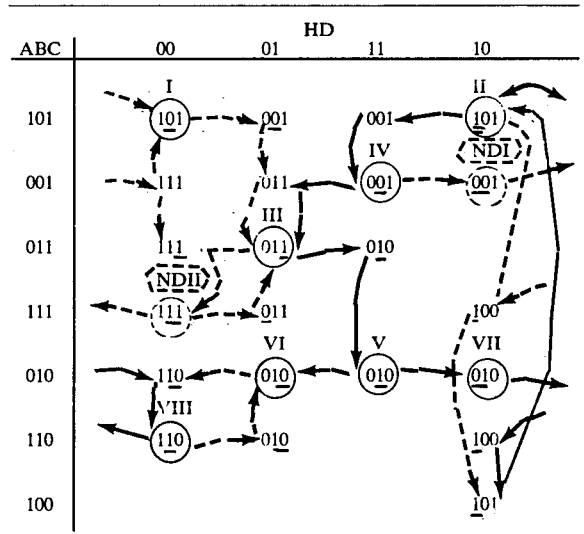

Table 2

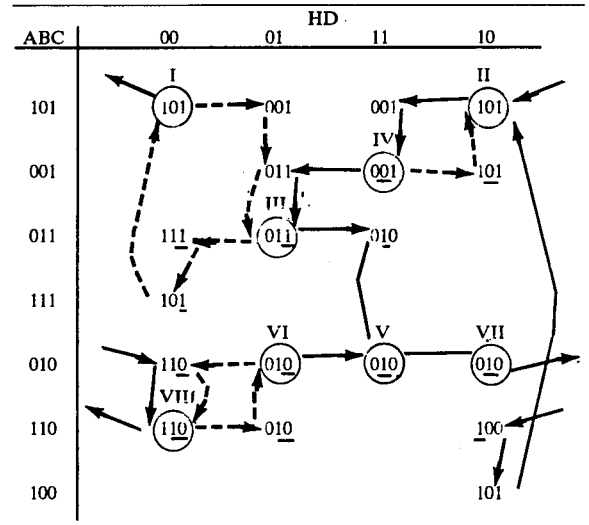

Figure 2A:
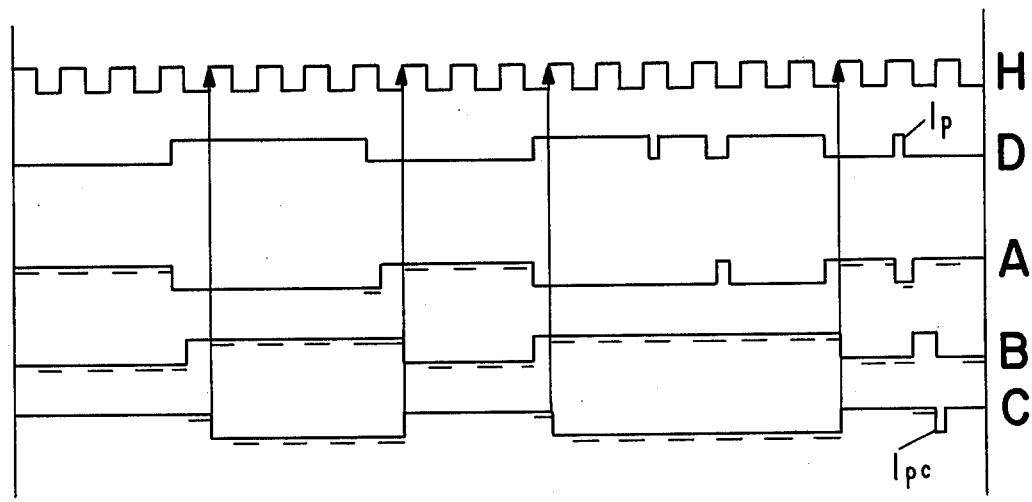

FIG. 2a gives the time diagram for this non-ideal dynamic D-flip-flop, showing each variable individually and again indicating by underlining the states retained by capacitance. The diagram clearly show that variable C (output $\overline{Q}$) is responsive only to the ascending transitions of the clock signal H. This diagram also shows why the described schematic cannot be designated as ideal: a disturbing pulse $I_p$ on variable D, while variable H is equal to 1 produces a distributing pulse $I_pC$ on variable D i.e. on output $\overline{Q}$. A disturbance of this kind must, therefore, be avoided to ensure proper operation of the described D-flip-flop. It must also be pointed out that clock signal H has to be kept above a certain minimum frequency so that the circuit will function correctly, since the circuit is dynamic. Command or control signal D is not subject to such a restriction. In other words, there is no lower limit to the rate of change of signal D.

Figure 3A:
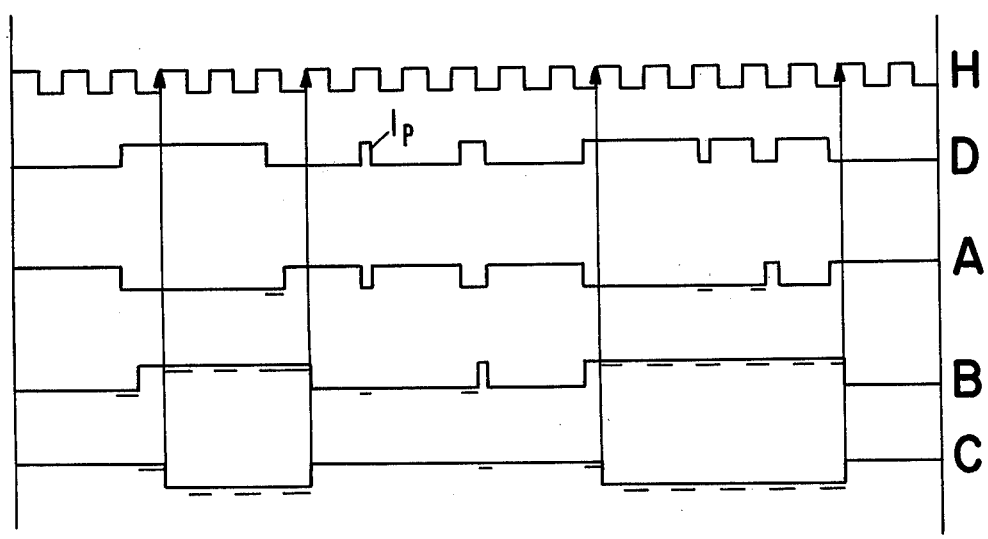
FIG. 3 is a schematic illustration of a variant of the invention showing an ideal dynamic D-flip-flop.
Figure 3:
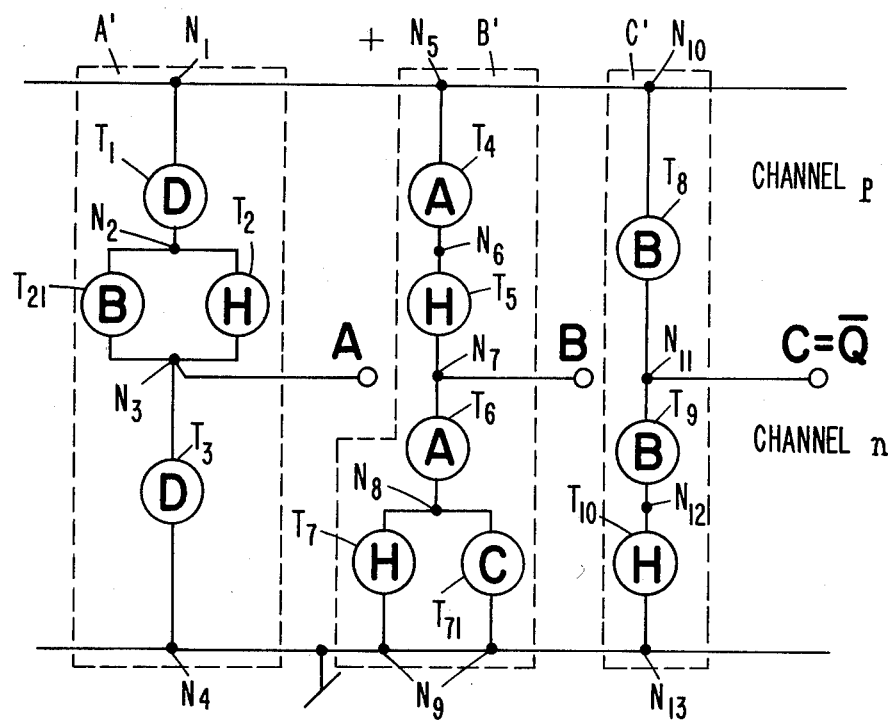

FIG. 3 shows how the basic structure described above can be made ideal. In other words, how the two undesired stable states NDI and NDII can be eliminated and a disturbing pulse $I_p$ on variable D made innocuous or harmless. It suffices to introduce two supplementary transistors, one parallel to transistor $T_2$ and the other parallel on transistor $T_7$. A new transistor $T_{21}$ is connected in parallel with transistor $T_2$ and must be controlled by internal variable B, while a new transistor $T_{71}$ connected in parallel with transistor $T_7$ must be commanded by internal variable C.

The function and the transitions that this ideal dynamic D-flip-flop can effect are represented in the table of states labeled Table 2 which follows, and give the same date as Table 1.

FIG. 3a shows quite well that in the circuitry of FIG. 3, a disturbing pulse $I_p$, as described above, has no influence whatsoever on variable C i.e. on output $\overline{Q}$. The circuit, therefore, functions ideally. The following detailed explanation of the transitions due to disturbing pulse $I_p$ illustrates the function of the new transistors $T_{21}$ and $T_{71}$.

If starting with stable state IV corresponding to ABC = 001 and HD = 11 we change variable D from one to zero, this is what happens for gate A':
 $T_1$ conducts,
 $T_2$ is blocked,
 $T_{21}$ conducts and
 $T_3$ is blocked.

In contrast to the non-ideal dynamic D-flip-flop of FIGS. 1 and 2, node $N_3$ of the ideal circuit in these conditions is connected to the positive pole, because the new transistor $T_{21}$ is conducting, since it is connected in parallel with blocked transistor $T_2$. Variable A thus assumes the value A = 1, which implies an intermediate state corresponding to the conditions ABC = 101 and HD = 10. For gate B' the following conditions exist:
 $T_4$ is blocked,
 $T_5$ is blocked,
 $T_6$ conducts,
 $T_7$ conducts and
 $T_{71}$ conducts which means that for this gate, it is not the new transistor $T_{71}$, but changing of the value of variable A that confirms variable B at B = 0. For gate C' the following conditions exist:
 $T_8$ conducts,
 $T_9$ is blocked and
 $T_{10}$ conducts with the effect that for this variable nothing changes, and it remains confirmed at its value C = 1.

In other words, transistor $T_{21}$ is significant, because when it undergoes the above-described transitions, the circuit returns to the desirable stable state II, which corresponds to the conditions ABC = 101 and HD = 10 instead of switching into undesired state NDI.

For the other transition critical for the non-ideal structure, according to FIGS. 1 and 2 which occurs when starting with stable state III, when ABC = 011 and HD = 01, it is possible to make HD = 00. For the ideal dynamic D-flip-flop circuit of FIG. 3, the following happens within gate A′:

$T_1$ conducts,
$T_2$ conducts,
$T_{21}$ is blocked and
$T_3$ is blocked.

Variable A then assumes the value A = 1, developing an intermediate state corresponding to ABC = 11$\underline{1}$ and HD = 00. Gate B′ then has the following conditions:

$T_4$ is blocked,
$T_5$ conducts,
$T_6$ conducts,
$T_7$ blocks and
$T_{71}$ conducts which means that the new transistor $T_{71}$ causes the change of state of variable B, because since $T_{71}$ is conducting, node $N_7$ is connected to ground. This results in variable B taking the value B = 0, so that there is a new intermediate state, wherein ABC = 10$\underline{1}$ and HD = 00, which has the following effect in gate C′:

$T_8$ conducts,
$T_9$ is blocked and
$T_{10}$ is blocked.

Therefore, varaible C assumes the value C = 1. It follows that, because of the new transistor $T_{71}$, the ideal circuit does not switch to an undesired stable following said critical transition but return to desirable stable state I, which correspqnds to the conditions ABC = 101 and HD = 00.

The above discussion confirms the accuracy of table 2, and the time diagram of FIG. 3a, which schematically illustrate the possible transitions of the different variables in the ideal dynamic D-flip-flop circuit according to FIG. 3.

As mentioned above, a dynamic D-flip-flop, whether it is ideal or not, requires a certain minimum frequency clock signal H, in order to function correctly. This is because we consider that certain variables, for certain conductivities of the transistors of the structure, are held at their values only by capacitances. From the two time diagrams 1 and 2, shown in FIGS. 2a and 3a respectively, it can be seen that the internal variables B and C are momentarily held at their values by capacitances, while external variable H is at zero, just as well as when clock signal H is on "one". This means that clock signal H must present limited duration of H = 1 and for H = 0.

A clock signal, whose duration is H = 1 or H = 0 is limited, but whose frequency may be arbitrarily low can command a so called semi-dynamic structure. To make the base structure according to FIGS. 1 and 2 semi-dynamic, one may introduce seven supplementary transistors, to produce a circuit with non-ideal semi-dynamic functioning, or eight transistors to have a circuit with ideal semi-dynamic functioning. Such a semi-dynamic D-flip-flop structure requires a clock signal H whose durations H = 1 must be limited, whereas the durations during which H = 0 can be of any length. If the p type transistors are replaced by n type transistors and vice versa, the H = 0 durations will be limited, whereas H = 1 can be of any duration.

Figure 4:
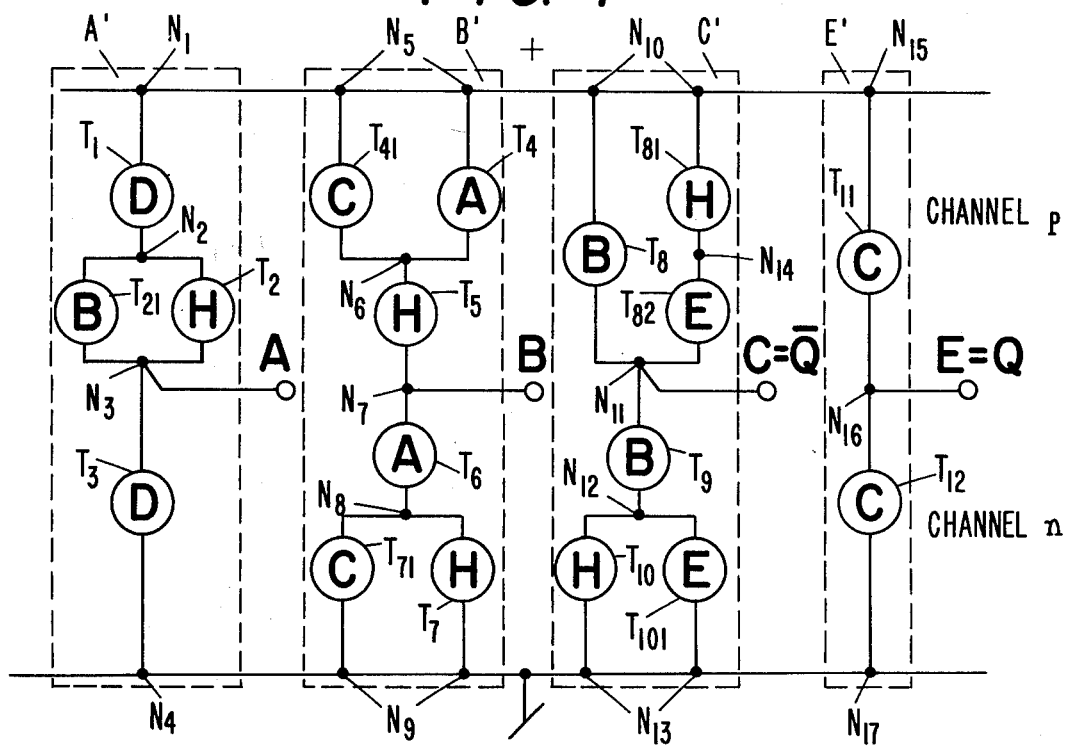
FIG. 4 is a schematic illustration of another variant of the invention showing an ideal semi-dynamic D-flip-flop, and FIG. 2a, 3a, 4a respectively are diagrammatical illustrations of pulse trains produced by D-flip-flop circuits of FIGS. 2, 3 and 4.
Figure 4A:
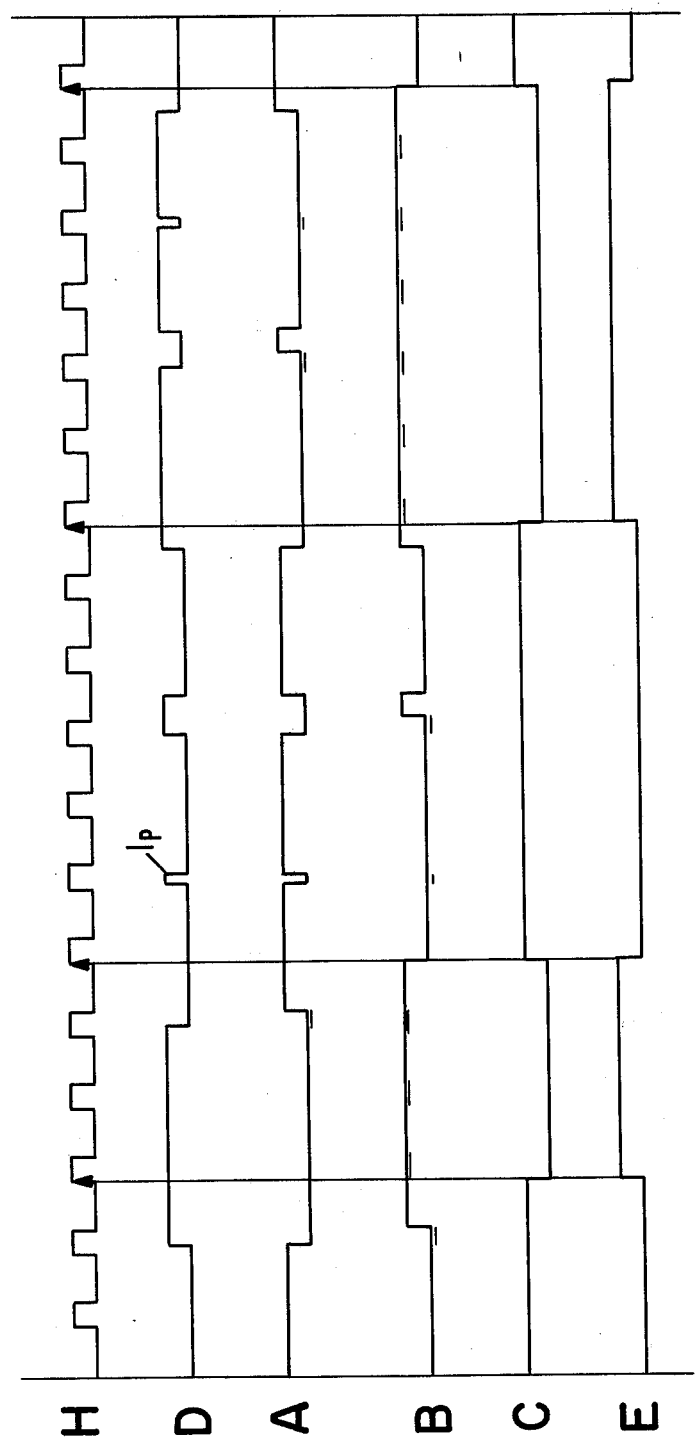

FIG. 4 shows the simplified schematic of an ideal semi-dynamic D-flip-flop. To make this structure non-ideal, we would eliminate transistor $T_{21}$ which would result in a circuit that could assume the undesired stable state NDI defined above.

In FIG. 4, we see that the semi-dynamic structure requires a supplementary internal variable $\overline{E} = \underline{C}$ for its functioning, which variable is the true value $\overline{Q}$ of inverse output Q.

Table 3 which follows illustrates the transitions effected by this structure. It also gives all the other information in the same way as for the other two tables.

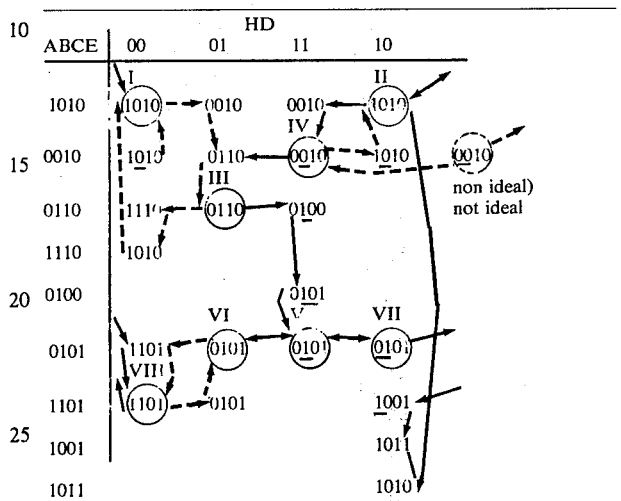

TABLE 3

The states of table 3 are practically identical with the states of tables 1 and 2, except that in table 3, each state is defined by an additional internal variable.

The advantages brought by the invention with respect to the state of the art are numerous, and are detailed in part by the above description. Nevertheless, it must also be observed that in addition to these functional advantages, the invention also allows the production of structures or circuits that require only a minimum surface area of a chip, because of the minimum number of active elements and the absolute absence of delay elements. This feature makes these structures especially advantageous for utilization in very small bulk apparatus, such for example, as electronic wrist watches. In addition, these circuits consume energy only during changes in state of the MOS transistors. No energy is required to hold the structures in a given state, except for losses. Accordingly, static energy consumption of the circuits is thus practically nil. The overall energy consumption is thus low, since consumption is practically limited only to dynamic consumption. Moreover, the invention is particularly advantageous, because it lends itself very well to easy manufacture, especially in CMOS technology. It may also readily be made responsive to the descending transistors of clock signal H by replacing the p channel transistors with n channel transistors and vice versa. Furthermore, since the circuit is an integrated circuit having a p-type region and an n-type region, it is possible to form the channel n-type transistors in the p-type region and the channel p-type transistors in the n-type region.

The invention is not strictly limited to the schematics that are shown, because it is possible to effect permutations among the transistors of the same channel in each gate without affecting the proper functioning of the described D flip-flops. The permutation of two transistors in series and with the same channel changes nothing in the function effected by these two transistors. It is also evident that all the D-flip-flops of the invention can be included within a complex circuit and on a chip that contains one or more different circuit structures.

What is claimed is:

1. A logic circuit for a dynamic D-flip-flop assembled with complementary field effect transistors having insulated grids comprising: a power of supply having a positive pole, a negative pole, and at least three logic gates (A', B', C'), each of which produces an internal variable (A, B, C), wherein each gate is formed by at least three field effect transistors with insulated grids connected in series between the positive pole and ground, and wherein each gate is controlled by at least two variables, one being an input clock signal (H), the first gate (A') including a first transistor ($T_1$) with a first type of conductivity having a source electrode connected by a first node ($N_1$) to the positive pole, and a drain electrode connected by a second node ($N_2$) to the source electrode of a second transistor ($T_2$) with the same type of conductivity, the drain electrode of said second transistor ($T_2$) is connected by a third node ($N_3$) on the one hand to the drain electrode of a third transistor ($T_3$) with a second type of conductivity whose source electrode is connected by a fourth node ($N_4$) to ground, and on the other hand to the grid of two transistors ($T_4$, $T_6$) of a second gate (B'), the grids of said first and third transistors ($T_1$, $T_3$) of the first gate (A') are connected to the input of an external command variable (D), and the gird of said second transistor ($T_2$) of said first gate (A') is connected to said input of the clock signal (H), the second gate (B') of the circuit includes a fourth transistor ($T_4$) having the first type of conductivity, and a grid connected to the drain electrode of said second transistor ($T_2$) of the first gate (A'), its source electrode being connected by a fifth node ($N_5$) to the positive pole and its drain electrode by a sixth node ($N_6$) to the source of a fifth transistor ($T_5$) having the first type of conductivity, the drain electrode of which is connected by a seventh node ($N_7$) on the one hand to the drain electrode of a sixth transistor ($T_6$) having a second type of conductivity, whose grid is connected to the drain electrode of said third transistor ($T_3$) of the first gate (A'), on the other hand the seventh node ($N_7$) connects the drain electrode of the fifth transistor ($T_5$) to the grids of two transistors ($T_8$, $T_9$) of the third gate (C'), the source electrodes of said sixth transistor ($T_6$) is connected by an eighth node ($N_8$) to the drain electrode of a seventh transistor ($T_7$) with the second type of conductivity, whose source electrode is connected by a ninth node ($N_9$) to ground, the grids of said fifth and seventh transistors ($T_5$, $T_7$) are connected to said input of the clock signal (H); the third gate (C') of the structure includes an eighth transistor ($T_8$) of the first type of conductivity, whose grid is connected to the drain electrode of said sixth transistor ($T_6$) of the second gate (B'), its source electrode is connected by a tenth node ($N_{10}$) to the positive pole and the drain electrode by an eleventh node ($N_{11}$) on the one hand to the output (C = $\overline{Q}$) of the circuit, and on the other hand to the drain electrode of a ninth transistor ($T_9$) with the second type of conductivity, whose grid is connected to the drain electrode of said sixth transistor ($T_6$) of the second gate (B'), its source electrode being connected by a twelfth node ($N_{12}$) to the drain electrode of a tenth transistor ($T_{10}$) with the second type of conductivity, whose source electrode is connected by a thirteenth node ($N_{13}$) to ground, and the grid to said input of the clock signal (H).

2. A logic circuit according to claim 1, including another transistor ($T_{21}$) having the first type of conductivity and connected in parallel with the second transistor ($T_2$) of the first gate (A'), the grid of which is connected to said input of the clock signal (H), and the source electrode of which is connected to the second node ($N_2$) connecting said second transistor ($T_2$) of the first gate (A') to the first transistor ($T_1$), whose source electrode is connected to the positive pole, the drain electrode of said second transistor ($T_2$) is connected to the third node ($N_3$) connecting the first gate (A') to the second, and the grid is connected by the seventh node ($N_7$) to the internal variable (B) produced by the second gate (B'); a transistor ($T_{71}$) with the second type of conductivity is connected in parallel on the seventh transistor ($T_7$) of the second gate (B'), connecting said gate to the negative pole, and whose drain electrode is connected to the eighth node ($N_8$) connecting said seventh transistor ($T_7$) of the second gate (B') to the sixth transistor ($T_6$), the source electrode being connected by a ninth node ($N_9$) to the zero pole, and the grid by an eleventh node ($N_{11}$) to the internal variable (C) produced by the third gate.

3. The circuit of claim 1, including a fourth gate (E') between the positive pole and ground, formed by an inverter including an eleventh transistor ($T_{11}$) having the first type of conductivity whose source electrode is connected by a fifteenth node ($N_{15}$) to the positive pole, the drain electrode by a sixteenth node ($N_{16}$) to the new output (E = Q) of the circuit and to the drain electrode of a twelfth transistor ($T_{12}$) with the second type of conductivity, whose source electrode is connected by a seventeenth node ($N_{17}$) to ground, the grids of said eleventh and twelfth transistors ($T_{11}$, $T_{12}$) being connected by the eleventh node ($N_{11}$) to the internal variable (C = $\overline{Q}$) produced by the third gate (C') of the circuit, a transistor ($T_{41}$) with the first type of conductivity connected in parallel on the fourth transistor ($T_4$) of the second gate (B'), and connecting said gate to the positive pole, the source electrode being also connected by a fifth node ($N_5$) to the positive pole, and the drain electrode by a sixth node ($N_6$) to the source electrode of the fifth transistor ($T_5$) of the second gate (B'), the drain electrode of which connects said second gate (B') to the third gate (C') and the grid by an eleventh node ($N_{11}$) to the internal variable (C) produced by the third gate (C'), a transistor ($T_{71}$) of the second type of conductivity connected in parallel on the seventh transistor ($T_7$) of the second gate (B') connecting said gate to ground, the drain electrode being connected to the eighth node ($N_8$) that connects said seventh transistor ($T_7$) of the second gate (B') to the sixth transistor ($T_6$) connected by its drain electrode to the fifth transistor ($T_5$) connecting the second gate (B') to the third gate (C'), the source electrode by a ninth node ($N_9$) to ground, and the grid by an eleventh node ($N_{11}$) to the internal variable (C) produced by the third gate (C') of the circuit, two transistors in series ($T_{81}$, $T_{82}$) with the first type of conductivity connected in parallel in the eighth transistor ($T_8$) of the third gate (C'), connecting said gate to the positive pole, the source electrode of the first of these two transistors ($T_{81}$) being connected by a tenth node ($N_{10}$) to the positive pole, the drain electrode to a new fourteenth node ($N_{14}$) and via it to the source electrode of the second of the said two transistors ($T_{82}$), and the grid to the input of the clock signal (H), the drain electrode of the second of the said transistors ($T_{82}$) being connected by an eleventh node ($N_{11}$) to the internal variable (C) produced by the third gate (C'), and the grid by a sixteenth node ($N_{16}$) to the new internal variable (E) produced by the new fourth gate (E'), and a transistor ($T_{101}$) with the second type of conductivity connected in parallel on the tenth transistor ($T_{10}$) of the third gate (C') connecting said gate to ground, and the drain electrode thereof being connected to the twelfth node ($N_{12}$) connecting said tenth transistor ($T_{10}$) of the third gate (C') to the ninth transistor ($T_9$) of said gate (C'), the source electrode by a thirteenth node ($N_{13}$) to the zero pole, and the grid by a sixteenth node ($N_{16}$) to the internal variable (E) produced by the new fourth gate (E').

4. The circuit of claim 3, wherein a transistor ($T_{21}$) with the first type of conductivity is connected in parallel with the second transistor ($T_2$) of the first gate (A') connecting said gate to the second gate (B'), and the source electrode of which is connected to the second node ($N_2$) connecting said second transistor ($T_2$) of the first gate (A') to the first transistor ($T_1$) connecting said gate to the positive pole, the drain electrode to the third node ($N_3$) connecting the first gate (A') to the second gate (B'), and the grid by a seventh node ($N_7$) to the internal variable (B) produced by the second gate (B').

5. The circuit of claim 1, wherein at least two of the transistors of the same type of conductivity, connected in series, can be subjected to mutual permutation without adversely affecting the function of the transistors.

6. The circuit of claim 1, wherein the first type of conductivity is $p$ type conductivity, and the second type of conductivity is the $n$ type conductivity.

7. The circuit of claim 1, wherein the first type of conductivity is $n$ type conductivity, and the second type of conductivity is of the $p$ type conductivity.

8. The circuit of claim 1 wherein the circuit is an integrated circuit formed on a single substrate and wherein the circuit has a $p$-type region and an $n$-type region, wherein there are channel $n$-type transistors formed in the $p$-type region and channel $p$-type transistors formed in the $n$-type region.

* * * * *

UNITED STATES PATENT OFFICE
CERTIFICATE OF CORRECTION

Patent No. 4,057,741  Dated November 8, 1977

Inventor(s) Christian Piguet

It is certified that error appears in the above-identified patent and that said Letters Patent are hereby corrected as shown below:

On the Cover Page,

Item [73]: Delete in its entirety.

*Signed and Sealed this*

*Twenty-fifth* Day of *July 1978*

[SEAL]

Attest:

RUTH C. MASON
*Attesting Officer*

DONALD W. BANNER
*Commissioner of Patents and Trademarks*